United States Patent [19]

Marsella

[11] Patent Number: 4,504,780
[45] Date of Patent: Mar. 12, 1985

[54] TEST PROBE

[76] Inventor: John R. Marsella, 96 Horseneck Rd., Warwick, R.I. 02886

[21] Appl. No.: 411,450

[22] Filed: Aug. 25, 1982

[51] Int. Cl.³ ............................................. G01N 31/02
[52] U.S. Cl. ................................ 324/72.5; 339/217 S;
    339/255 R; 324/158 P
[58] Field of Search ................. 324/65 P, 72.5, 158 F,
    324/158 P, 149, 158 R; 339/217 S, 255 R

[56] References Cited
U.S. PATENT DOCUMENTS 3,004,238 10/1961 Damon .............................. 339/217 S
3,748,633 7/1973 Lundergan ....................... 339/217 S
4,321,532 3/1982 Luna ................................. 324/158 P
4,397,519 8/1983 Cooney .............................. 324/158 P Primary Examiner—Michael J. Tokar
Attorney, Agent, or Firm—Barlow & Barlow

[57] ABSTRACT

A test probe has a housing that releasably receives a plunger that is normally urged out of the housing by a spring, and which has a probe contact end normally lying external of the housing. The plunger has a compressible enlargement that normally engages a stop on the housing, but with sufficient force being exerted, may be removed from the housing.

5 Claims, 4 Drawing Figures

U.S. Patent     Mar. 12, 1985     4,504,780
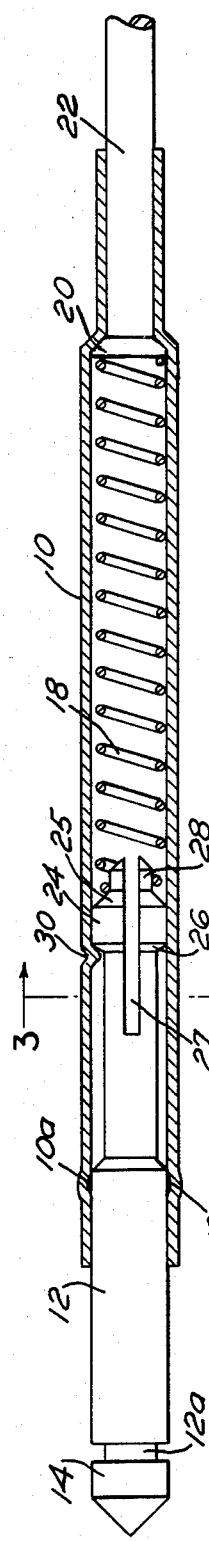
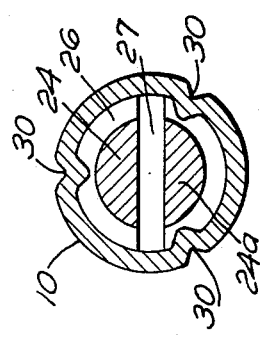
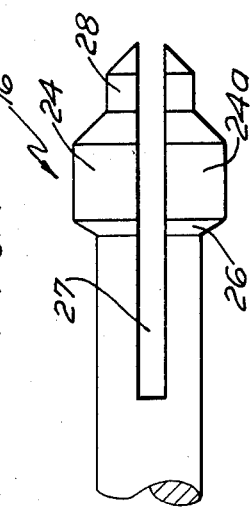
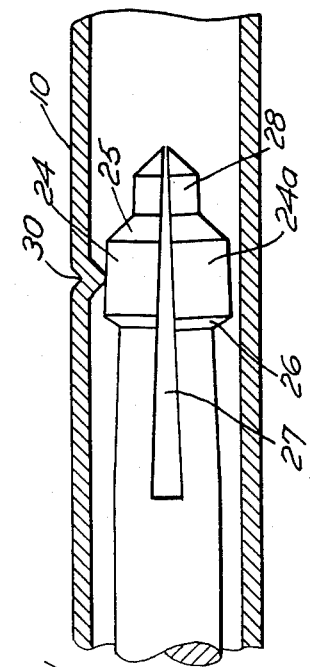
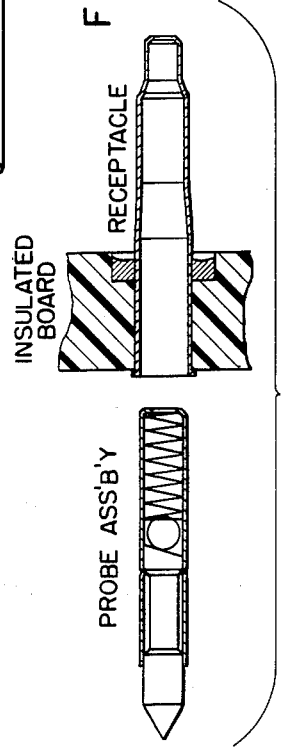

TEST PROBE

BACKGROUND OF THE INVENTION

This invention relates to the testing of printed circuit boards, and more particularly to the test probes that are used to make contact with the electronic circuitry on the circuit board. Test probes are basically made up of three parts: a plunger, a housing and a spring. The plunger and the spring are assembled into the housing and are held therein by crimping. When the test probe is assembled in this fashion, they are then typically inserted into a tubular receptacle which is mounted in an insulated board in a pattern that corresponds to the circuit pattern of the printed circuit board or other object being tested. Each receptacle is wired to a test set and with electronic circuits becoming more dense, it is becoming more and more common to find test probes mounted distances of a diameter apart with thousands of test points located on an insulated board which is referred to in the trade generally as a test fixture.

There may be electrical or mechanical failures in a probe or possibly tip damage thereto. This being the case, it is highly desirable that the spring probe be replaceable. Most of the probes now on the market are replaceable as an assembled unit; that is, the entire probe assembly has to be replaced by removing the same from the probe receptacle to which wiring is attached. It would be advantageous to eliminate the housing and still retain the ability to replace a probe contact. However, due to the closeness of the spacing of the probes as referred to above where the probes may be as closely spaced as 0.100 inch, it can be realized that this is an extremely delicate operation. As can be imagined, any attempt at repair must be arranged in a simple fashion to avoid damaging adjacent units. There is therefore a need for a test probe in which the plunger may be easily disassembled to replace the same should a failure occur, and also one which will exhibit a low electrical resistance.

SUMMARY OF THE INVENTION

It is a major object of the present invention to provide a simple test probe assembly which maintains the basic housing, plunger and spring elements and yet allows the plunger to be removed and replaced. Basically the housing of the test probe may be wired into a test fixture or insulated board and should any damage occur to the plunger that engages the printed circuit board under test, the plunger may be easily removed for replacement. An embodiment of the present invention is therefore a miniature low resistance test probe that includes a tubular housing and an inner plunger of an elongated nature and both made of an electrically conductive material. The plunger may have a probe head or tip external to the housing and by providing an enlargement on the plunger comprising at least a bifurcated pair of legs to exert a spring action, a sliding electrical connection is provided between the plunger and the inner wall of the housing. A coiled compression spring will urge the plunger outwardly of the housing and this spring will additionally form an electrical connection between the plunger and the housing. The plunger is retained within the housing by detents extending radially inwardly of the housing and at a position where the enlargement engages the detents. With sufficient force being exerted, the enlargement may be pulled by the detents, thus facilitating replacement of the plunger. With this arrangement a constant low resistance electrical connection is established between the enlargement and the housing, since the enlargement is spring-loaded outwardly into engagement with the inside wall thereof.

DESCRIPTION OF THE DRAWINGS

FIG. 1 is an enlarged view partly in section showing a test probe made in accordance with the invention;

FIG. 2 is an even further enlarged view of a portion of the plunger;

FIG. 3 is a sectional view taken on lines 3—3 of FIG. 1 on an enlarged scale; and FIG. 4 is a further enlarged partial sectional view showing the plunger being withdrawn from the housing.

DESCRIPTION OF THE PREFERRED EMBODIMENT

The test probe of the invention which is designed to be utilized in an insulated board which forms part of the test fixture comprises essentially a tubular housing 10 which has an inner plunger 12 received therein. The housing and the plunger are preferably made from electrically conductive material. The plunger 12 has a suitable probe end 14 which makes electrical connection with a printed circuit board or the like, while the inner end of the plunger has an enlargement as at 16 that provides a sliding electrical connection with the inner wall of the housing 10. A compression spring 18 engages the enlargement 16 of the plunger and the reduced end 20 of the housing 10, and normally urges the plunger 12 outwardly of the housing 10. The reduced end of the housing receives, for example, a wire wrap pin 22 to which an electrical connection may be readily made. It will also be understood that this wire connection means may take a variety of forms to suit the test fixture arrangement.

Referring now to FIG. 2, the enlargement 16 of the plunger has a portion thereof that is urged outwardly shown as a bifurcated end which yields two legs 24, 24a. The enlargement itself has tapered ends at 25 and 26. The interior end of the plunger is provided with a boss at 28 which provides a seat for the end of spring 18. The arrangement is such that the enlargement consisting of a pair of legs 24, 24a that are separated by the elongated slot 27, which legs provide in effect a wiping spring member that engages the inner wall of the housing to attain a substantially low resistance electrical contact between the plunger and the housing. Preferably the plunger and the housing are formed of a high conductive metal such as a copper alloy, and as will be seen by referring back to FIG. 1, the plunger 12 by virtue of the enlargement 16 is retained in position in the housing by the provision of a number of detents 30 which are formed in the housing 10 and which will engage the surface 26 of the enlargement. In addition, the housing is provided with protrusions 10a that effectively secure the housing by establishing a press fit into the insulated board that is part of the test fixture.

The construction of the enlargement is significant in the instant invention since it provides two distinct functions. First, establishing a low resistance electrical connection between the plunger and the housing; and secondly, it provides an arrangement whereby the plunger may be removed from the housing and replaced with a new plunger.

Referring now to FIG. 4, it will be seen that when sufficient force is exerted on the plunger, as for example, by having a tool engage a groove such as 12a on the plunger, and the plunger is withdrawn to the left as seen in the drawings, that is outwardly of the housing 10, the enlargement 16 will collapse and close the space in the slot 27. In effect, the bifurcated end of the plunger compresses against the forces exerted by the detents 30 in the housing, and this permits the plunger to be withdrawn from the housing. It will also be appreciated that the surface 25 will ease the insertion of a new plunger and since the surface 26 is at an increased angle to the axis, it will impede but not prevent the withdrawal of the old plunger.

I claim:

1. A test probe comprising an elongated tubular housing; a plunger received in said housing, said plunger having a probe end external to the housing and an enlargement at the inner end thereof slidably engaging the inner wall of the housing; a compression spring in said housing urging the plunger out of the housing; an inwardly directed detent means on the housing forming a stop for outward movement of the plunger; said enlargement having at least a portion thereof urged outwardly and compressible inwardly whereby the enlargement provides a low electrical resistance connection to the housing and yet permits removal of the plunger from the housing.

2. A probe as in claim 1 wherein the enlargement of the plunger is bifurcated and the portion urged outwardly is formed by the legs thereof.

3. A probe as in claim 1 wherein the enlargement is provided with a reduced end portion that extends within the compression spring.

4. A probe as in claim 1 wherein the enlargement has inwardly tapered ends.

5. A probe as in claim 1 wherein the plunger is provided with a recess in its exterior to facilitate removal from the housing.

* * * * *